United States Patent [19]
Yamano

[11] Patent Number: 5,677,874
[45] Date of Patent: Oct. 14, 1997

[54] NONVOLATILE SEMICONDUCTOR MEMORY DEVICE

[75] Inventor: Kaname Yamano, Ibaraki, Japan

[73] Assignee: Sharp Kabushiki Kaisha, Osaka, Japan

[21] Appl. No.: 635,478

[22] Filed: Apr. 22, 1996

[30] Foreign Application Priority Data

Apr. 24, 1995 [JP] Japan .................................. 7-098823

[51] Int. Cl.$^6$ .................................................. G11C 11/34
[52] U.S. Cl. .............................. 365/185.18; 365/185.33; 365/189.09; 365/226
[58] Field of Search ...................... 365/185.18, 185.33, 365/189.09, 226; 327/536

[56] References Cited

U.S. PATENT DOCUMENTS 5,009,143  4/1991  Arakawa ........................ 365/185.18 X
5,267,218  11/1993  Elbert ..................................... 365/226
5,508,971  4/1996  Cernea et al. ..................... 365/185.18

FOREIGN PATENT DOCUMENTS

6-203584  7/1994  Japan .

Primary Examiner—David C. Nelms
Assistant Examiner—Huan Hoang
Attorney, Agent, or Firm—Morrison & Foerster LLP

[57] ABSTRACT

A nonvolatile semiconductor memory device requiring a plurality of power supply voltages for operation includes: a DC-DC converter for boosting a first power supply voltage of a first voltage level externally supplied; and a charge pumping circuit for further boosting an output voltage obtained as a result of boosting by the DC-DC converter so as to supply a second power supply voltage of a second voltage level.

20 Claims, 6 Drawing Sheets

Writing

Erasing

FIG.11 PRIOR ART

NONVOLATILE SEMICONDUCTOR MEMORY DEVICE

BACKGROUND OF THE INVENTION

1. Field of the Invention:

The present invention relates to a nonvolatile semiconductor memory device requiring at least two different levels of power supply voltages for operation such as a flash memory.

2. Description of the Related Art:

A flash memory is one type of EEPROMs (Electrically Erasable Programmable Read Only Memories), which is an electrically erasable nonvolatile semiconductor memory device. The flash memory enables high integration to be realized by conducting an erasing operation in a whole device or in a block as a single unit. Thus, the flash memory is being not only used in the conventional use as an EEPROM, but also expected to be applied to a variety of fields as an inexpensive memory device having a large capacity.

Figure 6:
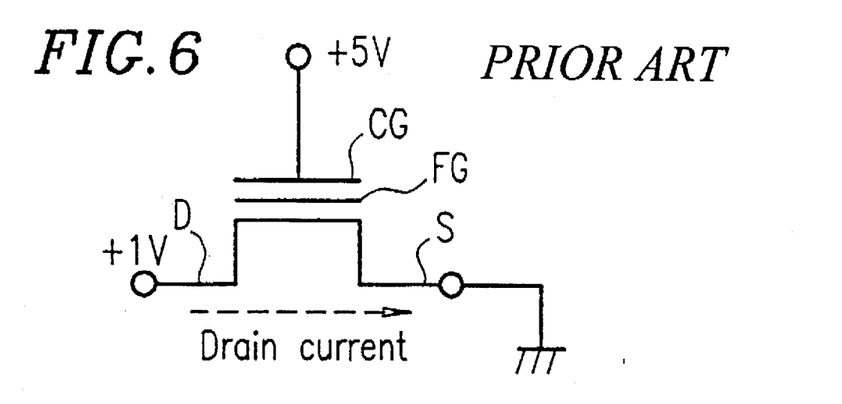
FIG. 6 is a circuit diagram showing an electrical connection of a memory cell at the time of reading data in a typical flash memory.
Figure 7:
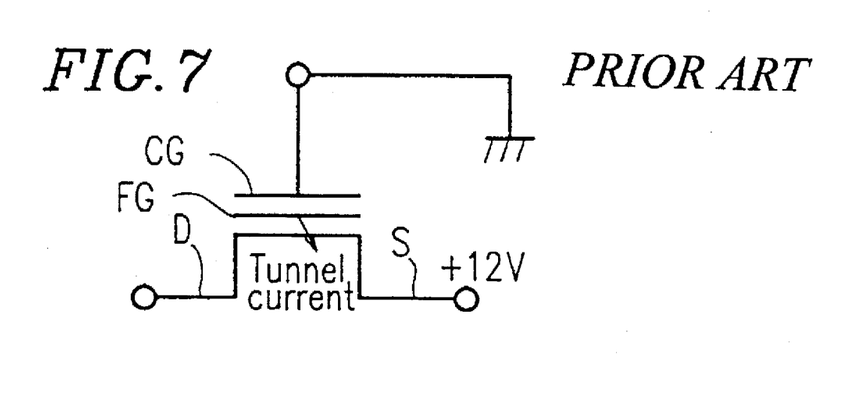
FIG. 7 is a circuit diagram showing an electrical connection of a memory cell at the time of erasing data in a typical flash memory.
Figure 8:
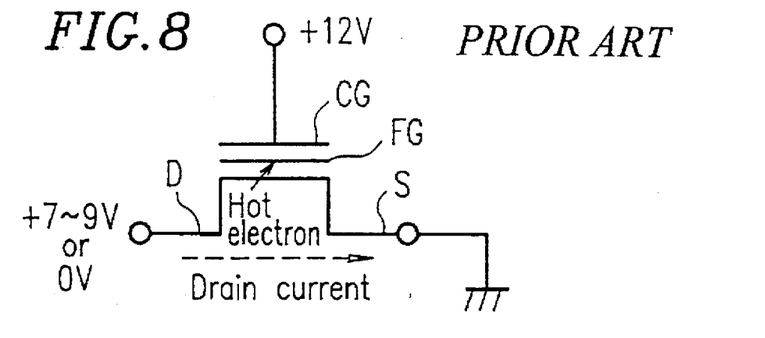
FIG. 8 is a circuit diagram showing an electrical connection of a memory cell at the time of writing data in a typical flash memory.

FIGS. 6 through 8 are schematic circuit diagrams showing electrical connections during operations in a typical structure of a memory cell in a flash memory.

In the memory cell in the flash memory, a gate electrode in a FET (Field Effect Transistor) having a MOS (Metal Oxide Semiconductor) structure has two gates, i.e., a control gate CG and a floating gate FG. Data is stored depending on the presence or absence of electrons in the floating gate FG.

At the time of reading out stored data, a voltage of about +5 V is applied to the control gate CG, a voltage of about +1 V is applied to a drain D, and a source S is grounded (0 V), as shown in FIG. 6. In the case where electrons are not present in the floating gate FG, a threshold voltage of the FET is low and a drain current flows between the drain D and the source S. On the other hand, in the case where electrons are present in the floating gate FG, the threshold voltage of the FET is high and such a drain current does not flow. Accordingly, data can be read out in accordance with the presence or absence of the electrons in the floating gate FG by detecting whether or not the electrical potential of the drain D is reduced by the drain current.

In order to erase the data stored as the presence or absence of the electrons in the floating gate FG, the control gate CG is grounded, and the drain D is set open, as shown in FIG. 7. At the same time, a voltage as high as about +12 V is applied to the source S. As a result, the electrons in the floating gate FG are expelled by a tunnel current and disappear. Thus, the stored data is erased.

In order to write data, in the case of an ordinary flash memory using hot electrons, a voltage as high as about +12 V is applied to the control gate CG and the source S is grounded in the state where data is erased, as shown in FIG. 8. At the same time, a voltage of about +7 to +9 V or 0 V depending on the data to be written is applied to the drain D. At this time, when a voltage of about +7 to +9 V is applied to the drain D, a large drain current flows between the drain D and the source S, and generates hot electrons. The thus generated hot electrons having high energy are injected to the floating gate FG. On the other hand, in the case where the drain D is grounded (i.e., a voltage of 0 V is applied to the drain D), the electron injection by hot electrons is not performed. Thus, whether the electron injection to the floating gate FG is performed or not can be controlled in accordance with a voltage applied to the drain D. This makes it possible to write data in the flash memory.

The flash memory is expected, in particular, to be used in a portable apparatus or the like, where a battery is used as the power source. In the operation of the flash memory, however, it is necessary to supply voltages as high as about +7 to +9 V or +12 V at the time of erasing and writing data, as described above. When power sources supplying such a high voltage exclusively used for these purposes are independently provided, the cost for power source circuits of the apparatus is tremendously increased. Therefore, it is conventionally proposed to provide a boosting circuit for boosting the power supply voltage Vcc to a high voltage Vpp so that the flash memory is operated by the single power source.

Figure 9:
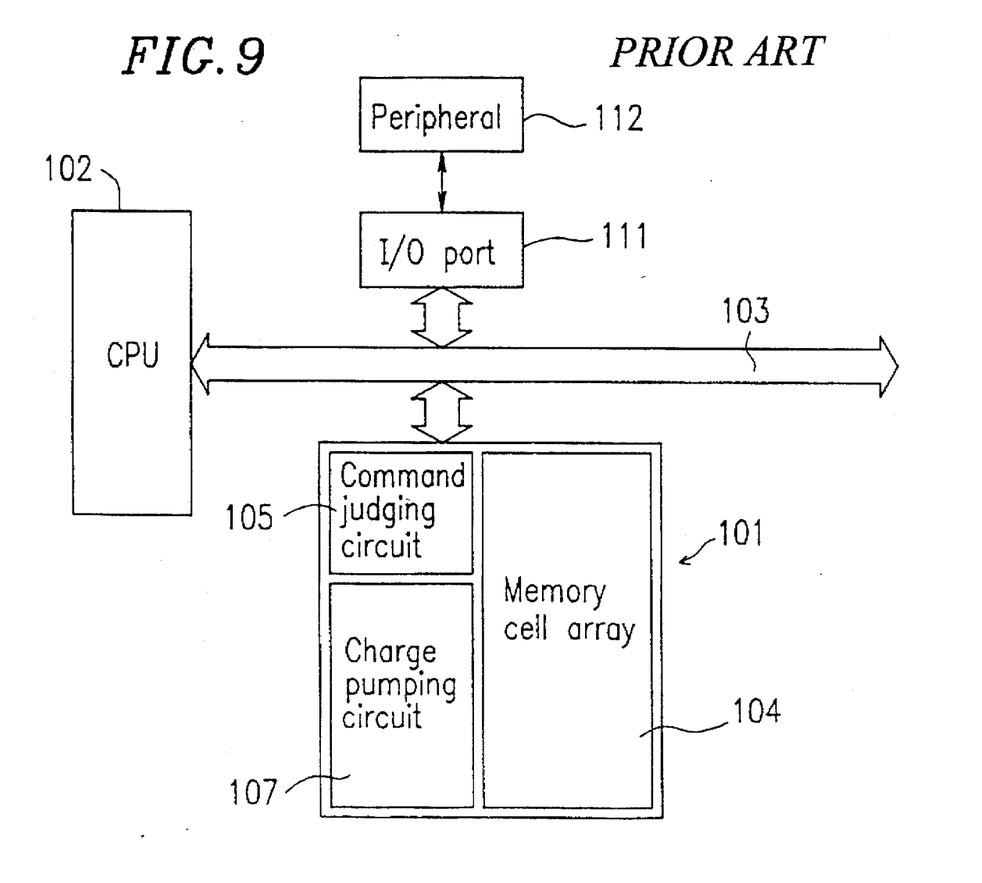
FIG. 9 is a block diagram showing an exemplary structure of a conventional flash memory and a system using the conventional flash memory.

FIG. 9 is a block diagram schematically showing a structure of a conventional flash memory 101 including a charge pumping circuit therein as the boosting circuit, and a system including such a conventional flash memory 101.

In FIG. 9, a flash memory 101 is connected to a CPU 102 for controlling the system via a bus line 103. A peripheral 112 and other various devices (not shown in FIG. 9) are connected to the bus line 103 via an I/O port 111. The flash memory 101 includes therein a memory cell array 104, a command judging circuit 105 and a charge pumping circuit 107 therein.

The command judging circuit 105 is a circuit for judging which operation out of data-writing, erasing and reading operations, a control signal delivered from the CPU 102 commands. When the command judging circuit 105 judges that the control signal for the writing or erasing operation requiring a high voltage is delivered, the command judging circuit 105 provides a boosting control signal to the charge pumping circuit 107 for supplying a high voltage. When these operations are completed, the command judging circuit 105 provides another boosting control signal for stopping the supply of the high voltage. The charge pumping circuit 107 supplies the high voltage and stops the supply thereof in accordance with the boosting control signals from the command judging circuit 105.

Figure 10:
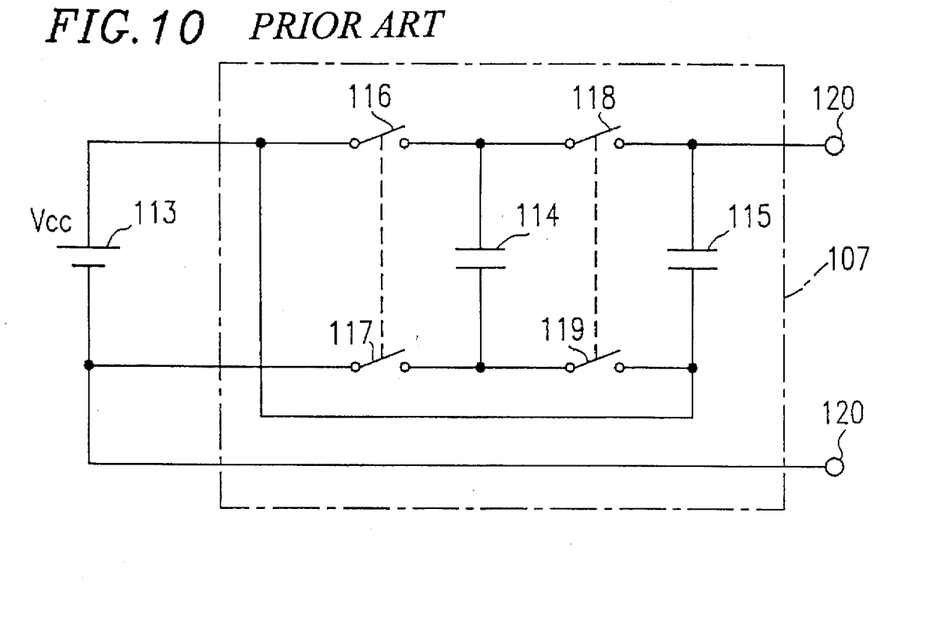
FIG. 10 is a circuit diagram showing an exemplary structure of a charge pumping circuit included in the system shown in FIG. 9.

FIG. 10 is a circuit diagram specifically showing an exemplary structure of the charge pumping circuit 107.

The charge pumping circuit 107 is supplied with a power supply voltage Vcc corresponding to the reference voltage of the system from the power source 113. The charge pumping circuit 107 includes a first capacitor 114 and a second capacitor 115. The electrodes of the first capacitor 114 are connected to the positive electrode and the negative electrode of the power source 113 via switches 116 and 117, respectively. The second capacitor 115 is connected to the first capacitor 114 in parallel via switches 118 and 119. In addition, the negative electrode of the second capacitor 115 is connected to the positive electrode of the power source 113. A high voltage is output from output terminals 120 connected to the negative electrode of the power source 113 and the positive electrode of the second capacitor 115. A solid-state switch having no mechanical contacts is generally used for the switches 116 to 119.

When the charge pumping circuit 107 receives a boosting control signal for supplying a high voltage from the command judging circuit 105, the switches 116 and 117 are first closed so as to charge the first capacitor 114. Then, these switches 116 and 117 are opened, whereas the switches 118 and 119 are closed. Thus, the voltage charged in the first capacitor 114 is then capacitively divided between the first capacitor 114 and the second capacitor 115 connected in parallel to each other. Moreover, since the negative electrode of the second capacitor 115 is connected to the positive electrode of the power source 113, the positive electrode of the second capacitor 115 is boosted to a voltage equivalent to the sum of the power supply voltage Vcc and a capacitively divided charged voltage. As a result, a voltage twice as high as the power supply voltage Vcc at the maximum can be obtained from the output terminals 120.

When a plurality of the charge pumping circuits 107 are connected in multiple stages, a voltage more than twice as high as the power supply voltage Vcc can be obtained. In this case, however, potential drops are caused by the internal resistance in the switches 116 to 119 and the capacitors 114 and 115. As a result, the voltage which can be actually obtained from the output terminals 120 is slightly lower than the theoretical value.

In order to obtain a boosted voltage, the voltage twice as high as the power supply voltage Vcc can be obtained from the positive electrode of the first capacitor 114 at the time when the switches 118 and 119 are closed, even without providing the second capacitor 115. With the second capacitor 115 provided, however, it becomes possible to adjust a boosted voltage value in the range from the power supply voltage Vcc to the voltage twice as high as the power supply voltage Vcc by changing the ratio of the capacitive division of the voltage charged by the capacitors 114 and 115. Moreover, when these two capacitors 114 and 115 are used, the fluctuation of output voltages is alleviated, in the case where the switches 118 and 119 are opened again so as to repeat the boosting operation.

The high voltage output from the charge pumping circuit 107 described above is supplied to the memory cell array 104 as shown in FIG. 9, so as to conduct the data-writing operation or the erasing operation. Therefore, in the flash memory 101, the data-writing operation or the erasing operation can be performed as a result of internally generating the high voltage in the flash memory by simply supplying the power supply voltage Vcc corresponding to the reference voltage of the apparatus.

In the charge pumping circuit 107, the high voltage can be obtained by simply switching the switches 116 to 119 after the charging of the first capacitor 114 is completed. Thus, the charge pumping circuit 107 can advantageously complete to boost the voltage in a short period of time. However, a voltage conversion efficiency of the charge pumping circuit 107 is about as low as 30%. Moreover, since a current is supplied only by the charges accumulated in the capacitors 114 and 115, the charge pumping circuit 107 disadvantageously has a low current supply capability. Thus, the conventional flash memory 101 using the charge pumping circuit 107 as the boosting circuit consumes power in a large quantity because of the low voltage conversion efficiency. This is an obstacle to the reduction of power consumption, in particular, in the case where the charge pumping circuit 107 is used in an apparatus using a battery as the power source.

Furthermore, in the case of an ordinary flash memory using hot electrons for injection of electrons, a large drain current of about several mA is required at the time of writing. Consequently, a drain current of several tens mA is required for the whole device. Therefore, in order to sufficiently supply the current of such a level, the capacitors 114 and 115 are required to have significantly a large capacitance value. As a result, the charge pumping circuit 107 takes up a large space, resulting in an obstacle to the miniaturization of the apparatus.

Figure 11:
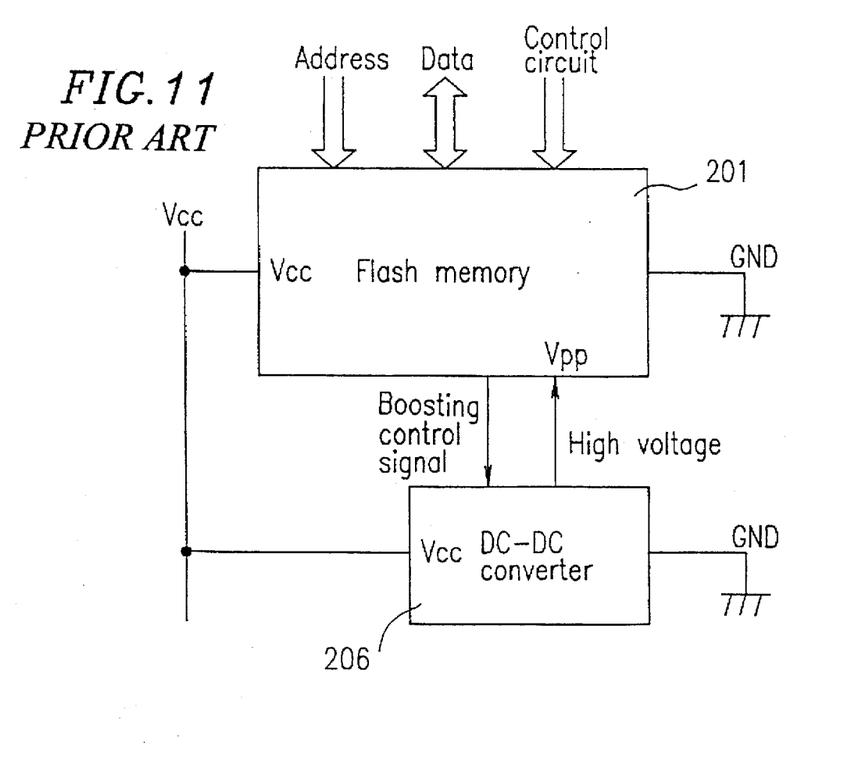
FIG. 11 is a block diagram showing a structure of a system including a flash memory and a DC-DC converter by a conventional technique.

On the other hand, a flash memory using a DC-DC converter as the boosting circuit is proposed in Japanese Laid-Open Patent Publication No. 6-203584. FIG. 11 is a block diagram schematically showing the system disclosed therein.

As shown in FIG. 11, a flash memory 201 provides a boosting control signal to a DC-DC converter 206, and is supplied with a high voltage Vpp from the DC-DC converter 206 at the same time. Furthermore, the flash memory 201 and the DC-DC converter 206 are supplied with a ground voltage GND and a power supply voltage Vcc corresponding to the reference voltage of the system from the power source.

A control signal is provided to the flash memory 201 from a control device (not shown) such as a CPU. In the case where the control signal is for a data-writing operation or an erasing operation, the flash memory 201 provides a boosting control signal to the DC-DC converter 206 for supplying a high voltage. Responding to the signal, the DC-DC converter 206 generates the high voltage Vpp by converting the voltage of the power supply voltage Vcc, so as to supply the high voltage Vpp to the flash memory 201. Responding to the supply of the high voltage Vpp, the flash memory 201 performs an operation of writing data or an operation of erasing data in the whole device or a block, based on addresses and data supplied from the control device such as the CPU.

Therefore, in the flash memory 201 having the above-mentioned structure, the control device such as the CPU can control the DC-DC converter 206 as if substantially a single power source is included. Furthermore, the DC-DC converter 206 may be externally connected to the system instead of being included in the system.

The DC-DC converter 206 advantageously provides a voltage conversion efficiency as high as 80%, and has a sufficient current supply capability. On the other hand, a long period of time is disadvantageously required to obtain a predetermined high voltage with the DC-DC converter, because the voltage is gradually boosted by repeating a switching operation. Thus, in the system using the DC-DC converter 206 as the boosting circuit shown in FIG. 11, it takes a long period of time to complete a series of operations starting from providing the control signal for data-writing or data-erasing, obtaining a predetermined high voltage and actually performing the operation of writing data or the operation of erasing data. As a result, the performance of the system using the flash memory 201 is extremely deteriorated.

The aforementioned problems are not limited to the conventional flash memories 101 and 201 having the structure described above, but common to a nonvolatile semiconductor memory device requiring at least two different levels of power supply voltages for operation.

SUMMARY OF THE INVENTION

According to one aspect of the invention, a nonvolatile semiconductor memory device requiring a plurality of power supply voltages for operation includes: a DC-DC converter for boosting a first power supply voltage of a first voltage level externally supplied; and a charge pumping circuit for further boosting an output voltage obtained as a result of boosting by the DC-DC converter so as to supply a second power supply voltage of a second voltage level.

According to another aspect of the invention, a nonvolatile semiconductor memory device requiring a plurality of power supply voltages for operation includes: a DC-DC converter for boosting a first power supply voltage of a first voltage level externally supplied so as to supply a second power supply voltage of a second voltage level; and a charge pumping circuit for further boosting the second power supply voltage of the second voltage level obtained as a result of boosting by the DC-DC converter so as to supply a third power supply voltage of a third voltage level.

Herein, "the first, second and third voltage levels" refer to respective electrical potential differences with respect to the common reference voltage. When voltage values corresponding to the first, second and third voltage levels are represented by $V_1$, $V_2$ and $V_3$, respectively, the voltage values $V_1$, $V_2$ and $V_3$ can be, for example, positive voltages set in the order from the smallest electrical potential difference with respect to a ground voltage as the reference voltage (i.e., $V_1<V_2<V_3$). Alternatively, when an arbitrary positive voltage can be set as the reference voltage, another positive voltage having a smaller absolute value than the reference value can be set as the first voltage level, 0 V can be set as the second voltage level, and a negative voltage can be set as the third voltage level (i.e., $V_1>V_2>V_3$ in comparison of the actual voltage values). These values are suitably set depending on the specification required for a nonvolatile semiconductor memory device to be produced.

The DC-DC converter and the charge pumping circuit can be formed on the same semiconductor substrate on which the nonvolatile semiconductor memory device is formed. Alternatively, the DC-DC converter and the charge pumping circuit may be formed on discrete substrates so as to constitute a hybrid IC, or each may be made as a separate unit and then connected to each other. Even in the case where the DC-DC converter and the charge pumping circuit are formed on the same semiconductor substrate, an inductance device, a capacitor and the like included therein can be provided in the outside.

Thus, the invention described herein makes possible the advantage of providing a nonvolatile semiconductor memory device capable of realizing a sufficient level of operational performance such as power consumption, current supply capability and operation speed, by using a boosting circuit obtained by combining the charge pumping circuit and the DC-DC converter.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described in detail by way of examples with respect to the accompanying drawings.

Figure 1:
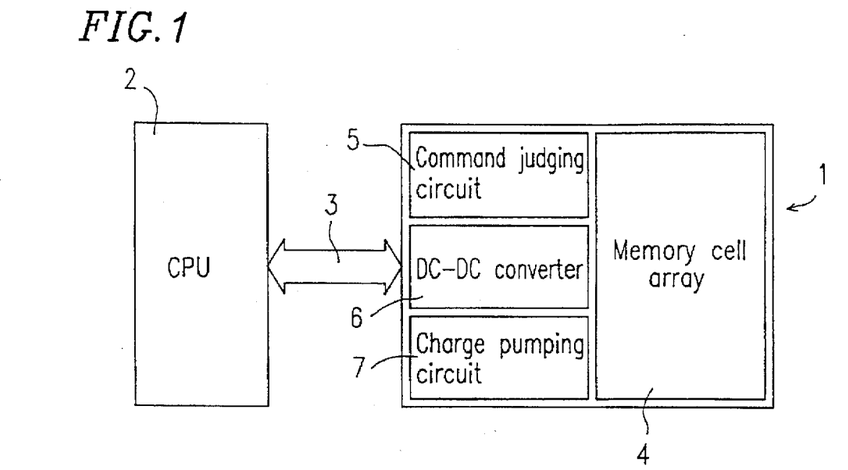
FIG. 1 is a block diagram showing a structure of a flash memory in an example of the present invention.
Figure 2:
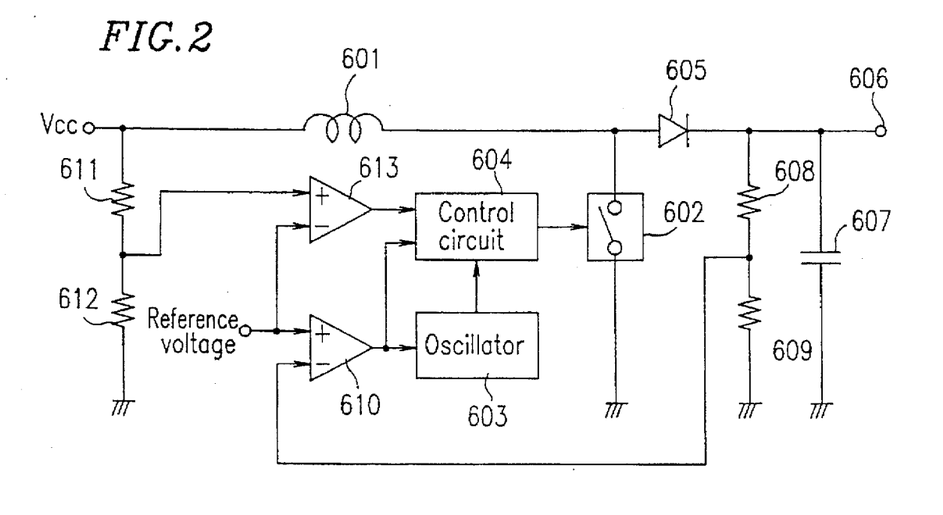
FIG. 2 is a block circuit diagram showing an exemplary structure of a DC-DC converter in the flash memory shown in FIG. 1.
Figure 3:
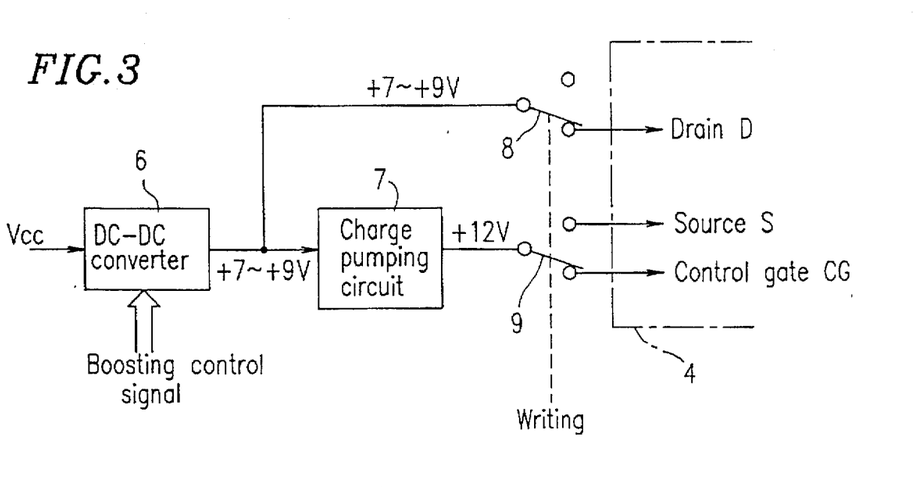
FIG. 3 is a block diagram showing electrical connections of the DC-DC converter, a charge pumping circuit and a memory cell array at the time of writing data in the flash memory shown in FIG. 1.
Figure 4:
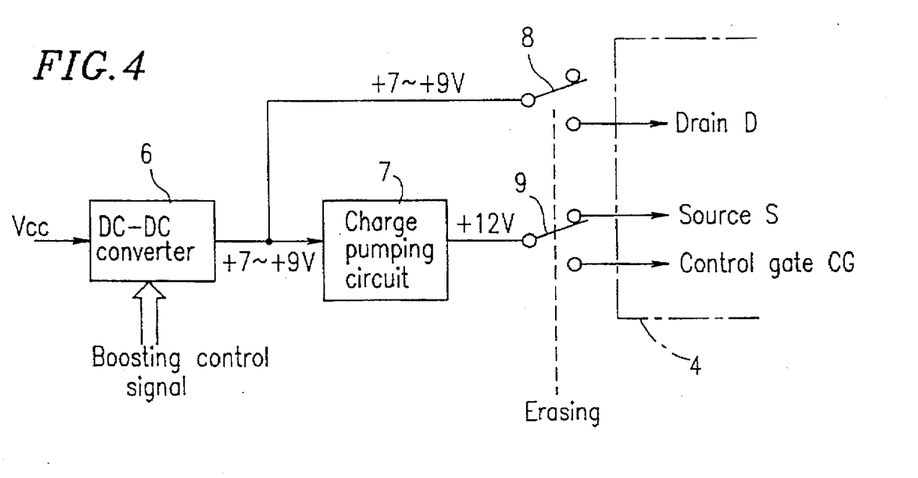
FIG. 4 is a block diagram showing electrical connections of the DC-DC converter, the charge pumping circuit and the memory cell array at the time of erasing data in the flash memory shown in FIG. 1.
Figure 5:
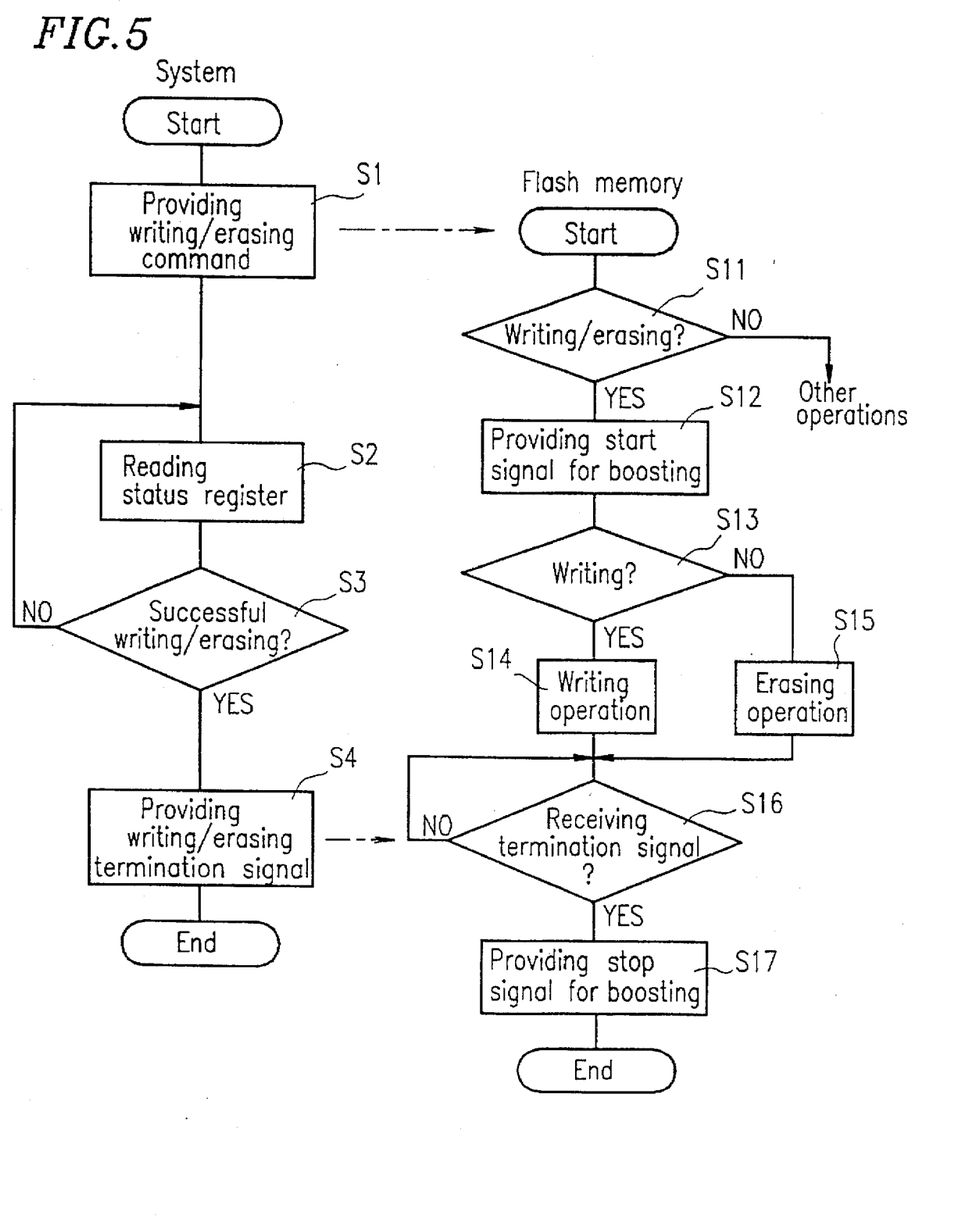
FIG. 5 is a flow chart showing operations of the flash memory shown in FIG. 1.

FIGS. 1 through 5 show an example of the present invention. More specifically, FIG. 1 is a block diagram showing a structure of a flash memory in an example of the present invention. FIG. 2 is a block circuit diagram showing an exemplary structure of a DC-DC converter included in the flash memory shown in FIG. 1. FIG. 3 is a block diagram showing electrical connections of the DC-DC converter, a charge pumping circuit and a memory cell array at the time of writing data in the flash memory shown in FIG. 1. FIG. 4 is a block diagram showing electrical connections of the DC-DC converter, the charge pumping circuit and the memory cell array at the time of erasing data in the flash memory shown in FIG. 1. FIG. 5 is a flow chart showing operations of the flash memory shown in FIG. 1.

In the present example, a case where a flash memory is used as a nonvolatile semiconductor memory device will be described. The present invention can be realized using other types of nonvolatile semiconductor memory devices, provided that it requires at least two different levels of power supply voltages for operation.

In an electronic apparatus shown in the present invention, a power supply voltage Vcc of, for example, +5 V is supplied from a battery (not shown) mounted inside the apparatus via a constant voltage circuit as a single power source. As shown in FIG. 1, a flash memory 1 is connected to a CPU 2 for controlling this electronic apparatus via a bus line 3. The flash memory 1 includes therein a memory cell array 4, and a command judging circuit 5, as well as DC-DC converter 6 and a charge pumping circuit 7 as boosting circuits therein.

The command judging circuit 5 includes a decoder circuit, a control circuit and the like, and judges which operation out of data-writing, erasing and reading operations, a control signal provided from the CPU 2 commands. When the command judging circuit 5 judges that the control signal for the operation of writing or erasing which requires a high voltage is provided, the command judging circuit 5 provides a boosting control signal to the DC-DC converter 6, as described in detail later.

The DC-DC converter 6 will be now described in detail.

The DC-DC converter 6 is a DC voltage conversion circuit obtained by combining an inverter and a rectifying circuit. The inverter, including an inductance device and an oscillating circuit, is a circuit for converting a DC waveform to an AC waveform or a pulsating waveform. The oscillating circuit referred to herein is not limited to an ordinary oscillating circuit for oscillating a sine wave, but can be an oscillating circuit for oscillating waves having other waveforms such as a rectangular wave. Alternatively, the oscillating circuit can be a so-called chopper circuit for repeatedly discontinuing between the inductance device and the power source by self-excitation or external excitation. The rectifying circuit includes a rectifying device such as a diode, and typically further includes a capacitor for smoothing waveforms.

In the present example, a so-called boosting chopper circuit shown in FIG. 2 is used as the DC-DC converter 6.

In this DC-DC converter 6, an inductance device 601 and a switch 602 are connected between the power supply voltage Vcc and the ground level, thus constructing the inverter. The inductance device 601 is typically a coil. The switch 602 is typically a solid-state switch which is controlled its ON/OFF switching operations repeatedly by a control circuit 604 in accordance with an oscillating cycle of an oscillator 603.

Furthermore, an output terminal 606 is connected via a diode 605 to a connecting node between the inductance device 601 and the switch 602. In addition, a smoothing capacitor 607 for stabilizing an output voltage is connected between the output terminal 606 and the ground, thus constructing the rectifying circuit.

When the switch 602 goes ON as a result of being controlled by the control circuit 604, a current is supplied from the power supply voltage Vcc to the inductance device 601, so that magnetic energy is accumulated in the inductance device 601.

When the switch 602 goes OFF so as to stop the current, the magnetic energy accumulated in the inductance device 601 is converted to current by electromagnetic induction (self-induction). Then, the current flows through the diode 605 and charges the smoothing capacitor 607. By repeating these operations, a terminal voltage of the smoothing capacitor 607 is raised, so that a high voltage can be output from the output terminal 606.

The voltage of the output terminal 606 is gradually raised by repeating the ON/OFF switching operations of the switch 602 and increasing electric charges stored in the smoothing capacitor 607. Accordingly, it takes a certain period of time to reach a point where a predetermined high voltage can be stably output. However, once a high voltage is stably output from the terminal 606, a current is continuously supplied by repeating the ON/OFF switching operations of the switch 602. Thus, a current supply capability is sufficiently enhanced. Moreover, the DC power is subjected to conversion by the inverter (chopper circuit) and the rectifying circuit, resulting in a high voltage conversion efficiency of about 80%.

The inductance device 601 requires a certain size for enduring a sufficient inductance value, so that there are limitations of the miniaturization. For this reason, the inductance device 601 is generally provided in the outside of the flash memory 1.

In the DC-DC converter 6, voltage-dividing resistors 608 and 609 are connected in parallel to the smoothing capacitor 607, for the purpose of detecting the high voltage output from the output terminal 606. The voltage divided by the voltage-dividing resistors 608 and 609 is input to an inversion input of a differential amplifier 610. A reference voltage is input to a non-inversion input of the differential amplifier 610. The reference voltage is a constant voltage which does not depend on the fluctuation of the power supply voltage Vcc and is obtained using a Zener diode (not shown) or the like based on the power supply voltage Vcc. More specifically, the reference voltage is set so as to match a divided voltage obtained by the voltage-dividing resistors 608 and 609 when the output voltage from the output terminal 606 reaches a predetermined high voltage.

The differential amplifier 610 amplifies an electrical potential difference between the inversion input and the non-inversion input so as to output the results. When the divided voltage input to the inversion input exceeds the reference voltage, the differential amplifier 610 provides a signal of an L level to the oscillator 603 and the control circuit 604. Upon receiving the signal of the L level from the differential amplifier 610, the oscillator 603 stops oscillating, and the control circuit 604 forces the switch 602 to go into an OFF state. When current flows from the output terminal 606 in this state, the smoothing capacitor 607 is discharged so that the voltage drops. Thus, the divided voltage obtained by the voltage-dividing resistors 608 and 609 becomes lower than the reference voltage, so that the output from the differential amplifier 610 becomes an H level. Upon receiving the output of H level from the differential amplifier 610, the oscillator 603 then resumes oscillation, and the control circuit 604 resumes allowing the switch 602 to perform the switching operations of ON/OFF in this oscillating cycle.

As described above, in the structure shown in FIG. 1, the output voltage from the output terminal 606 in the circuit structure shown in FIG. 2 is detected so as to control the operation of the DC-DC converter 6 so that the output voltage from the output terminal 606 constantly maintains a predetermined high voltage.

The DC-DC converter 6 of the present example is set so as to output a voltage of about +7 V to +9 V (hereinafter, referred to as "an intermediate voltage"), which is lower than the high voltage of about +12 V required by the flash memory 1. Therefore, compared with the conventional devices which boost the voltage to about +12 V, the DC-DC converter 6 can stabilize the output voltage in a relatively short period of time.

In the DC-DC converter 6, voltage-dividing resistors 611 and 612 are connected between the power supply voltage Vcc and the ground for the purpose of watching the power supply voltage Vcc. The divided voltage obtainable by the voltage-dividing resistors 611 and 612 is input to the non-inversion input of another differential amplifier 613. The reference voltage is input to the inversion input of the differential amplifier 613. The divisional ratio of the voltage-dividing resistors 611 and 612 is set so that the divided voltage matches the reference voltage when the power supply voltage Vcc is a prescribed voltage value.

The differential amplifier 613, which is an amplifier similar to the differential amplifier 610, provides a signal of an H level to the control circuit 604 when the divided voltage input to the non-inversion input exceeds the reference voltage, and provides a signal of an L level when the divided voltage becomes lower than the reference voltage.

The control circuit 604 controls a duty ratio of ON/OFF operations of the switch 602 in accordance with the output from the differential amplifier 613. More specifically, when the output from the differential amplifier 613 is at the H level, a period of time during which the switch 602 is ON is shortened so as to lower the voltage which the DC-DC converter 6 can boost. On the other hand, when the output from the differential amplifier 613 is at the L level, a period of time during which the switch 602 is ON is prolonged so as to raise the voltage which the DC-DC converter 6 can boost. Thus, by controlling the boosting ability of the DC-DC converter 6 in accordance with the voltage values of the power supply voltage Vcc, the circuit operation is optimized, and high voltage conversion efficiency is maintained.

The differential amplifier 613 can be constructed so as to output an analog voltage obtained as a result of amplifying a differential voltage between the divided voltage and the reference voltage in a non-saturation region. In this case, the control circuit 604 controls a duty ratio of ON/OFF operations of the switch 602 in accordance with this analog voltage.

Then, the charge pumping circuit 7 will be described in detail.

The charge pumping circuit 7 is basically a boosting circuit including a capacitor, a switch for charging the capacitor with the power supply voltage Vcc, and another switch for inverting the connection between one electrode of the capacitor and the power supply voltage Vcc. For example, the charge pumping circuit 7 can have the same structure as the conventional example shown in FIG. 10. In the charge pumping circuit 7 of the present example, however, an intermediate voltage of about +7 to +9 V obtained by the boosting operation of the DC-DC converter 6, instead of the power supply voltage Vcc, is further boosted to a voltage as high as +12 V.

In the case where the charge pumping circuit 7 has a one-stage structure, the boosting is completed by one cycle of operations of charging the capacitor and switching, so that a high voltage can be obtained in a short period of time. However, since current is supplied only from the capacitor where charges are accumulated, the current supply capability of the charge pumping circuit 7 is not very high. Moreover, the voltage conversion efficiency is about 30%, which is relatively low. However, in the present example, the voltage is boosted from about +7 to +9 V to about +12 V, which is a relatively small difference in the electrical potential. Accordingly, although the voltage conversion efficiency of the charge pumping circuit 7 is relatively low, waste in power associated with the voltage conversion thereof during boosting is smaller than in the conventional example.

The capacitor used in the charge pumping circuit 7 can be provided in the outside of the flash memory 1 in the case where it is difficult to be provided therein.

As shown in FIGS. 3 and 4, the power supply voltage Vcc is supplied to the DC-DC converter 6. The intermediate voltage (+7 to +9 V) which is output after being boosted by the DC-DC converter 6 is supplied to the charge pumping circuit 7. Upon receiving a signal for starting the boosting operation as a boosting control signal from the command judging circuit 5 shown in FIG. 1, the DC-DC converter 6 starts the above-mentioned boosting operation. When the intermediated voltage output from the DC-DC converter 6 reaches a predetermined voltage, the charge pumping circuit 7 starts its boosting operation.

The intermediated voltage output from the DC-DC converter 6 is also provided to a selecting switch 8. On the other hand, the high voltage (+12 V) which is output from the charge pumping circuit 7 is provided to a selecting switch 9. These selecting switches 8 and 9 are circuits for switching between at the time of writing and at the time of erasing.

At the time of writing, as shown in FIG. 3, the intermediated voltage output from the DC-DC converter 6 is supplied via the selecting switch 8 to a drain D in a selected memory cell in a memory cell array 4. The high voltage output from the charge pumping circuit 7 is supplied via the selecting switch 9 to a control gate CG in the selected memory cell in the memory cell array 4. Thus, the memory cell array 4 performs the writing operation.

On the other hand, at the time of erasing, as shown in FIG. 4, the selecting switches 8 and 9 change their connection, so that the intermediated voltage output from the DC-DC converter 6 is not supplied to the memory cell array 4, but only the high voltage output from the charge pumping circuit 7 is supplied via the selecting switch 9 to a source S in the memory cell in a block being subjected to the erasing operation in the memory cell array 4. Thus, the memory cell array 4 performs the erasing operation.

The memory cell in the flash memory 1 at the time of data-writing and erasing is electrically connected in the same manner as the aforementioned typical example referring to FIGS. 7 and 8.

Hereinafter, operations at the time of data-writing and erasing with respect to the flash memory 1 having the above-mentioned structure will be described with reference to the flow chart shown in FIG. 5. The flow chart on the left of FIG. 5 shows an operation of the CPU 2 of the system (hereinafter, referred to as "system side"). The flow chart on the right of FIG. 5 shows an internal operation of the flash memory 1.

First, at Step 1, the CPU 2 provides a data-writing command or erasing command via a bus line 3 to the flash memory 1. In the case where the data-writing command is provided, an address and data to be written are subsequently provided.

Hereinafter, "Step 1" is referred to as "S1", and other steps with different numbers are referred to likewise.

In the flash memory 1, upon receiving a provided command, a command judging circuit 5 judges whether the command is for writing or erasing (S11). Herein, when the command for an operation not requiring a high voltage such as a readout operation is provided, it is possible to perform the operation only by the power supply voltage Vcc, so that the operation instructed by the command is performed without any other operations. On the contrary, in the case where the command for writing or erasing is provided, a high voltage is required, so that the command judging circuit 5 provides a signal for starting the boosting operation to the DC-DC converter 6 (S12). Upon receiving the signal for starting the boosting operation, the DC-DC converter 6 starts the above-mentioned boosting operation immediately.

When the output voltage from the DC-DC converter 6 reaches a predetermined intermediate voltage (about +7 to +9 V), a charge pumping circuit 7 starts an boosting operation to output a high voltage (about +12 V). When the output voltage from the DC-DC converter 6 is stabilized at a predetermined intermediate voltage, the command judging circuit 5 judges the content of the command (S13). When the command is for writing, the writing operation is performed (S14). When the command is for erasing, the erasing operation is performed (S15).

In the writing operation at S14, the selecting switches 8 and 9 are set as shown in FIG. 3. At the same time, the address and data provided from the CPU 2 via the bus line 3 are received, and the writing operation is performed in accordance with the data in the memory cell selected based on the address. More specifically, in the same manner as the typical operational example previously described referring to FIG. 8, a high voltage (+12 V) supplied from the charge pumping circuit 7 is applied to the control gate CG in the selected memory cell. At the same time, the source S is grounded. An intermediate voltage (+7 to +9 V) supplied from the DC-DC converter 6 is applied to the drain D or the drain D is grounded, depending on the data to be written.

In the case where the intermediate voltage is applied to the drain D, a large drain current for generating hot electrons flows in the selected memory cell. Since the DC-DC converter 6 has a high current supply capability, the DC-DC converter 6 can sufficiently supply the drain current with using such an intermediate voltage. On the other hand, since little current flows in the control gate CG, the charge pumping circuit 7 which applies a high voltage to the control gate CG does not require the high current supply capability. Then, when it is confirmed that data is written, a flag for indicating the success in writing the data is set in a status register.

In the erasing operation at S15, the selecting switches 8 and 9 are set as shown in FIG. 4. At the same time, in the same manner as the typical operational example described earlier referring to FIG. 7, the control gate CG is grounded with respect to each memory cell in the memory cell array 4. At the same time, the drain D is set open, and a high voltage (+12 V) supplied from the charge pumping circuit 7 is applied to the source S. At this point, since little current flows into the source S, the charge pumping circuit 7 which applies a high voltage to the source S does not require the high current supply capability. Then, when it is confirmed that data is erased, a flag for indicating the success in erasing the data is set in the status register.

In the system side, after a writing command or an erasing command is provided at S1, the content of the status register of the flash memory 1 is read out via the bus line 3 (S2). It is judged whether the writing operation or the erasing operation has succeeded or not by checking whether the flag of the status register is set or not (S3). In the case where it is judged that the writing operation or the erasing operation has not succeeded yet, the CPU returns its operation to S2 and waits for these operations to succeed.

When the writing operation at S14 or the erasing operation at S15 are completed so that the flag of the status register is set, the flag is detected at S3. Then, the CPU 2 provides a writing or erasing terminating signal to the flash memory 1 via the bus line 3, so as to complete all the operations of the system side. Nevertheless, when the data-writing or erasing operation of the flash memory 1 is to be subsequently performed, the termination signal is not provided at S4, but the operations can be repeated, starting from S1.

When the writing operation at S14 or the erasing operation at S15 are completed, the flash memory 1 waits for the termination signal to be provided from the CPU 2 (S16). Upon receiving the termination signal, the command judging circuit 5 provides a stop signal for terminating the boosting operation to the DC-DC converter 6. Thus, the DC-DC converter 6 stops the boosting operation so as to complete all the operations of the flash memory 1.

In the case where the flash memory 1 receives another writing or erasing command while waiting for the termination signal at S16, the operations can be repeated, going back to the operation at S11. In this way, the flash memory 1 waits for the termination signal to be provided from the system side before actually terminating the boosting operation of the DC-DC converter 6 at S17. This eliminates a waste which otherwise might be produced by starting the boosting operation of the DC-DC converter 6 all over again from the outset when the data-writing or erasing operation is to be subsequently performed. However, in the case where a predetermined period of time elapses without receiving the termination signal nor the writing or erasing command at S16, the operation of the flash memory 1 may be shifted to S17 so as to complete its operation, for the purpose of avoiding wastefully consuming power.

As described above, according to the flash memory 1 of the present example, the power supply voltage Vcc of +5 V is first boosted to an intermediate voltage of about +7 to +9 V using the DC-DC converter 6. Then, the thus obtained intermediate voltage is boosted using the charge pumping circuit 7 to obtain a high voltage of about +12 V. By such an operation, compared with the conventional example for boosting the power supply voltage Vcc to a high voltage only using the charge pumping circuit 7 which has a low voltage conversion efficiency, the voltage conversion can be relatively efficiently performed and the power consumption can be reduced. Thus, in the case where the flash memory 1 is used in a portable apparatus having a battery as the power source, the life of the battery can be prolonged.

Furthermore, compared with the conventional example for boosting the power supply voltage Vcc to a high voltage only using the DC-DC converter 6 which requires a long period of time for boosting, a high voltage can be promptly and stably obtained. Accordingly, the operation speed of the flash memory 1 can be raised, and thus preventing the performance of the electronic apparatus from deteriorating. For example, in the present example, compared with the case where boosting is performed only using the DC-DC converter 6, it is possible to shorten the period of time required for boosting by about 3 to 4 μs. Moreover, it is an intermediate voltage of about +7 to +9 V, which is lower than a high voltage, that is boosted by the DC-DC converter 6. As a result, the burden put on the switch 602 can be reduced.

Furthermore, the flash memory 1 of the present example is supplied with the intermediate voltage of about +7 to +9 V which is to be applied to the drain D in the selected memory cell at the time of writing from the DC-DC converter 6 having a high current supply capability. Thus, a large drain current for flowing into the drain D can be sufficiently supplied.

When the power supply voltage Vcc is, for example, 5 V, it is possible to directly apply this power supply voltage Vcc to the drain D in the selected memory cell at the time of writing. However, in the portable apparatus or the like having a battery as the power source, the power supply voltage Vcc has been recently reduced for the purpose of reducing the power consumption. As a result, many of the portable apparatus having a battery as the power source are driven by the power supply voltage of 3 V. In such a case, the power supply voltage Vcc is too low to be directly applied to the drain D in the selected memory cell, so that an intermediate voltage of +7 to +9 V is necessarily required. When the intermediate voltage can be directly supplied from the DC-DC converter 6 as in the present example, it is unnecessary to provide a lowering circuit for lowering the high voltage of about +12 V obtained by boosting.

The gains and the losses in the case where a high voltage is generated by the DC-DC converter 6 and the charge pumping circuit 7 in combination, and the case where the high voltage is generated only either by the charge pumping circuit 7 or the DC-DC converter 6 are shown in Table 1.

TABLE 1

|  | Charge Pumping Circuit | DC-DC Converter | Present Example |
| --- | --- | --- | --- |
| Power Consumption | Largest | Smallest | Small |
| Period of Time for Boosting | Shortest | Longest | Shorter |
| Current Supply Capability | Low | High | High |

In the case where only the charge pumping circuit 7 is used, the power consumption is largest, and the current supply capability is small, but the period of time for boosting is shortest. In the case where only the DC-DC converter 6 is used, the period of time for boosting is longest, but the power consumption is smallest and the current supply capability is sufficient.

On the other hand, according to the present invention in which the charge pumping circuit and the DC-DC converter are both used, the power consumption is relatively small, the period of time for boosting is relatively short, and the current supply capability is sufficient with respect to an intermediate voltage. Accordingly, in view of the performance of the whole system, the present invention is easiest for a designer to use. Thus, the flash memory 1 which satisfactorily performs overall can be obtained.

In the aforementioned structure, the power supply voltage of a low voltage level is first boosted to an intermediate voltage by the DC-DC converter, and the thus obtained intermediate voltage is then boosted by the charge pumping circuit to a high voltage so that the high voltage is supplied as the power supply voltage which is used in operations. Thus, by externally supplying only a single power supply voltage of a low voltage level, a nonvolatile semiconductor memory device requiring at least two different levels of power supply voltages can be operated.

In addition, compared with the case where the power supply voltage of a low voltage level is boosted to a high voltage only by the charge pumping circuit, the voltage can be more efficiently converted since the DC-DC converter is also used, so that the power consumption can be reduced. Moreover, compared with the case where the power supply voltage is boosted to a high voltage only by the DC-DC converter, the high voltage can be promptly obtained, resulting from a smaller proportion of the boosting by the DC-DC converter which requires a long period of time for boosting, so that the operation speed can be raised.

Furthermore, the voltage level to be applied to the switch circuit of the DC-DC converter is lowered.

Therefore, in the case where the nonvolatile semiconductor memory device requiring at least two different levels of power supply voltages is operated by a single power source, the power consumption can be relatively reduced with no operation speed penalty. Moreover, the burden on the switch circuit for voltage resistance can be alleviated.

Furthermore, in the aforementioned structure, the voltage boosted by the DC-DC converter can be supplied as the power supply voltage of an intermediate level, and the voltage boosted by the charge pumping circuit can be supplied as the power supply voltage of a high voltage. Therefore, three different levels of power supply voltages are supplied to the nonvolatile semiconductor memory device without separately providing a circuit for lowering the voltage. In addition, in the case where the power supply voltage of the intermediate level requires a large current during operations, a sufficient current can be supplied by the DC-DC converter having a high current supply capability.

Thus, in the case where the nonvolatile semiconductor memory device requiring three different levels of power supply voltages is operated by a single power source, it is not only unnecessary to provide the circuit for lowering the voltage in order to obtain an intermediate voltage, but also a large current can be supplied to the intermediate voltage.

Furthermore, the aforementioned structure provides an advantage to a flash memory requiring that a large current flows between the drain terminal and the source terminal by applying the power supply voltage of an intermediate voltage during the data-writing operation. Namely, in such a flash memory, a sufficient current can be supplied from the DC-DC converter having a high current supply capability. Moreover, this flash memory does not require the large current in the case where the power supply voltage of a high voltage is supplied, so that it is sufficiently supplied from the charge pumping circuit having a low current supply capability.

As apparent from the description above, according to the nonvolatile semiconductor memory device of the present invention, the nonvolatile semiconductor memory device requiring at least two different levels of power supply voltages can be operated by a single power source. At the same time, the power consumption is made relatively small without considerably slowing down the operation speed. Thus, in view of the performance of the whole system, a nonvolatile semiconductor memory device which is easy for the designer to use and satisfactorily performs overall can be provided. Moreover, since the proportion of boosting by the DC-DC converter is small, the burden on the switch circuit for switching the boosted voltage can be alleviated.

Furthermore, since the power supply voltage of an intermediate voltage is supplied from the DC-DC converter, in the nonvolatile semiconductor memory device requiring three different levels of power supply voltages for operation, it is unnecessary to separately provide a circuit for lowering the voltage. In particular, the nonvolatile semiconductor memory device such as a flash memory can perform a reliable operation as a result of sufficient supply of the current from the DC-DC converter.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device requiring a plurality of power supply voltages for operation, comprising:

a DC-DC converter for boosting a first power supply voltage of a first voltage level externally supplied; and a charge pumping circuit for further boosting an output voltage obtained as a result of boosting by the DC-DC converter so as to supply a second power supply voltage of a second voltage level, wherein the DC-DC converter includes an inverter circuit and a rectifying circuit, the inverter circuit including an inductance device and an oscillating circuit, the rectifying circuit including a rectifying device.

2. A nonvolatile semiconductor memory device according to claim 1, wherein the first voltage level is different from a reference voltage by a first electrical potential difference, the second voltage level is different from the reference voltage by a second electrical potential difference, and an absolute value of the second electrical potential difference is larger than an absolute value of the first electrical potential difference.

3. A nonvolatile semiconductor memory device according to claim 1, wherein the charge pumping circuit is a boosting circuit including a capacitor and a switch.

4. A nonvolatile semiconductor memory device requiring a plurality of power supply voltages for operation, comprising:

a DC-DC converter for boosting a first power supply voltage of a first voltage level externally supplied so as to supply a second power supply voltage of a second voltage level; and a charge pumping circuit for further boosting the second power supply voltage of the second voltage level obtained as a result of boosting by the DC-DC converter so as to supply a third power supply voltage of a third voltage level, wherein the nonvolatile semiconductor memory device is a flash memory, and the second power supply voltage of the second voltage level supplied by the DC-DC converter is applied between drain-source terminals during a writing operation of the flash memory.

5. A nonvolatile semiconductor memory device according to claim 4, wherein the first voltage level is different from a reference voltage by a first electrical potential difference, the second voltage level is different from the reference voltage by a second electrical potential difference, the third voltage level is different from a reference voltage by a third electrical potential difference, an absolute value of the second electrical potential difference is larger than an absolute value of the first electrical potential difference, and an absolute value of the third electrical potential difference is larger than absolute values of the first and second electrical potential differences.

6. A nonvolatile semiconductor memory device according to claim 4, wherein the DC-DC converter includes an inverter circuit and a rectifying circuit, the inverter circuit including an inductance device and an oscillating circuit, the rectifying circuit including a rectifying device.

7. A nonvolatile semiconductor memory device according to claim 4, wherein the charge pumping circuit is a boosting circuit including a capacitor and a switch.

8. A nonvolatile semiconductor memory device requiring a plurality of power supply voltages for operation, comprising:

a DC-DC converter for boosting a first power supply voltage of a first voltage level externally supplied; and a charge pumping circuit for further boosting an output voltage obtained as a result of boosting by the DC-DC converter so as to supply a second power supply voltage of a second voltage level, wherein the nonvolatile semiconductor memory device is a flash memory, and the output voltage obtained as a result of boosting by the DC-DC converter is applied between drain-source terminals during a writing operation of the flash memory.

9. A nonvolatile semiconductor memory device according to claim 8, wherein the first voltage level is different from a reference voltage by a first electrical potential difference, the second voltage level is different form the reference voltage by a second electrical potential difference, and an absolute value of the second electrical potential difference is larger than an absolute value of the first electrical potential difference.

10. A nonvolatile semiconductor memory device according to claim 8, wherein the DC-DC converter includes an inverter circuit and a rectifying circuit, the inverter circuit including an inductance device and an oscillating circuit, the rectifying circuit including a rectifying device.

11. A nonvolatile semiconductor memory device according to claim 8, wherein the charge pumping circuit is a boosting circuit including a capacitor and a switch.

12. A nonvolatile semiconductor memory device requiring a plurality of power supply voltages for operation, comprising:

a DC-DC converter for boosting a first power supply voltage of a first voltage level externally supplied so as to supply a second power supply voltage of a second voltage level; and a charge pumping circuit for further boosting the second power supply voltage of the second voltage level obtained as a result of boosting by the DC-DC converter so as to supply a third power supply voltage of a third voltage level, wherein the DC-DC converter includes an inverter circuit and a rectifying circuit, the inverter circuit including an inductance device and an oscillating circuit, the rectifying circuit including a rectifying device.

13. A nonvolatile semiconductor memory device according to claim 12, wherein the nonvolatile semiconductor memory device is a flash memory, and the second power supply voltage of the second voltage level supplied by the DC-DC converter is applied between drain-source terminals during a writing operation of the flash memory.

14. A nonvolatile semiconductor memory device according to claim 12, wherein the first voltage level is different from a reference voltage by a first electrical potential difference, the second voltage level is different from the reference voltage by a second electrical potential difference, the third voltage level is different form a reference voltage by a third electrical potential difference, an absolute value of the second electrical potential difference is larger than an absolute value of the first electrical potential difference, and an absolute value of the third electrical potential difference is larger than absolute values of the first and second electrical potential differences.

15. A nonvolatile semiconductor memory device according to claim 12, wherein the charge pumping circuit is a boosting circuit including a capacitor and a switch.

16. A nonvolatile semiconductor memory device requiring a plurality of power supply voltages for operation, comprising:

a DC-DC converter for boosting a first power supply voltage of a first voltage level externally supplied so as to supply a second power supply voltage of a second voltage level; and a charge pumping circuit for further boosting the second power supply voltage of the second voltage level obtained as a result of boosting by the DC-DC converter so as to supply a third power supply voltage of a third voltage level, wherein each of the first power supply voltage, the second power supply voltage and the third power supply voltage is used for operation of the nonvolatile semiconductor memory device.

17. A nonvolatile semiconductor memory device according to claim 16, wherein the nonvolatile semiconductor memory device is a flash memory, and the second power supply voltage of the second voltage level supplied by the DC-DC converter is applied between drain-source terminals during a writing operation of the flash memory.

18. A nonvolatile semiconductor memory device according to claim 16, wherein the first voltage level is different form a reference voltage by a first electrical potential difference, the second voltage level is different from the reference voltage by a second electrical potential difference, the third voltage level is different forma reference voltage by a third electrical potential difference, an absolute value of the second electrical potential difference is larger than an absolute value of the first electrical potential difference, and an absolute value of the third electrical potential difference is larger than absolute values of the first and second electrical potential differences.

19. A nonvolatile semiconductor memory device according to claim 16, wherein the DC-DC converter includes an inverter circuit and a rectifying circuit, the inverter circuit including an inductance device and an oscillating circuit, the rectifying circuit including a rectifying device.

20. A nonvolatile semiconductor memory device according to claim 16, wherein the charge pumping circuit is a boosting circuit including a capacitor and a switch.

* * * * *